United States Patent [19]
Dolby

[11] Patent Number: 4,786,879
[45] Date of Patent: Nov. 22, 1988

[54] ATTENUATOR CIRCUIT EMPLOYING BOOTSTRAPPING

[76] Inventor: Ray M. Dolby, 3340 Jackson St., San Francisco, Calif. 94118

[21] Appl. No.: 14,620

[22] Filed: Feb. 25, 1987

Related U.S. Application Data

[63] Continuation-in-part of Ser. No. 835,245, Mar. 3, 1986, abandoned.

[51] Int. Cl.⁴ .......................... H03F 1/26; H03G 7/00
[52] U.S. Cl. .................................. 330/145; 330/149; 330/156; 330/284; 333/14
[58] Field of Search ................ 330/86, 145, 149, 156, 330/282, 284; 333/14, 81 R; 381/94, 106; 455/72

[56] References Cited

U.S. PATENT DOCUMENTS 4,137,466  1/1979  Schemmel et al. ............... 330/86 X

FOREIGN PATENT DOCUMENTS 696592  11/1979  U.S.S.R. ............................ 330/284

Primary Examiner—James B. Mullins
Attorney, Agent, or Firm—Majestic, Gallagher, Parsons & Siebert

[57] ABSTRACT

When impedance elements such as FETs are used in attenuators, the elements have linear responses only when the signals attenuated are below certain signal levels. When signal conditions causing the element to operate non-linearly are detected, bootstrapping is applied to reduce the voltage across the element so that the element will operate linearly. The control signal at the gate of the element is then modified to compensate for the increase in effective impedance of the element caused by bootstrapping. The improved attenuators are especially useful in signal compressors and expanders.

25 Claims, 5 Drawing Sheets

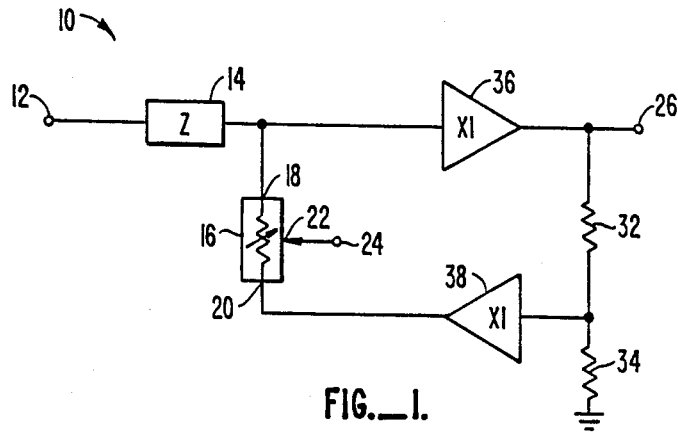
FIG._1.
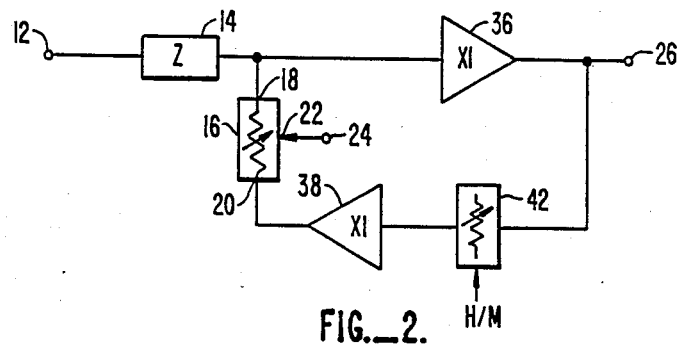
FIG._2.
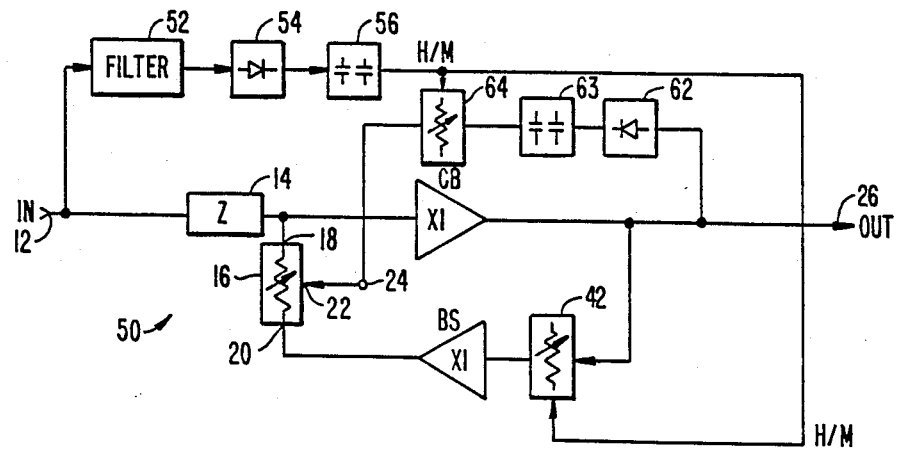
FIG._3.

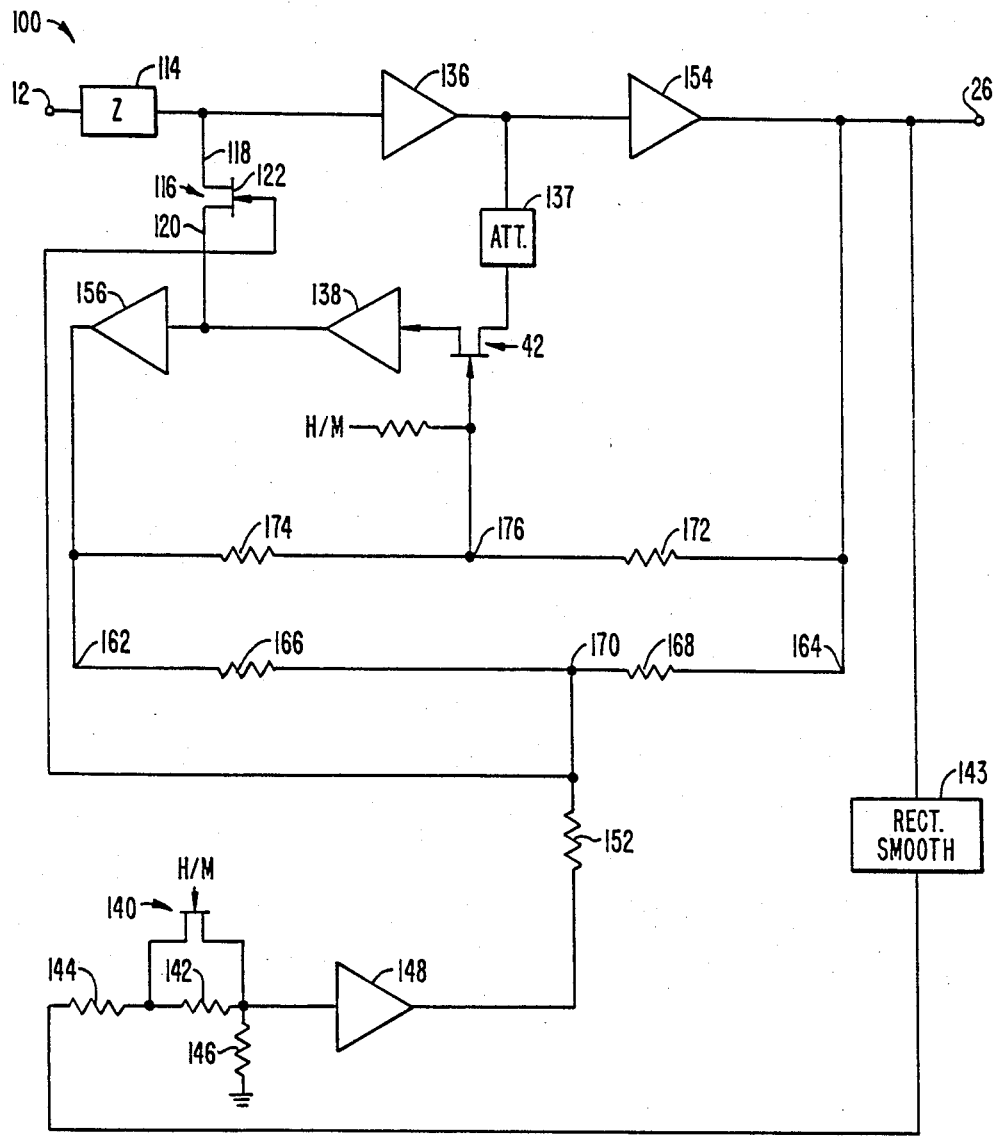
FIG._4.

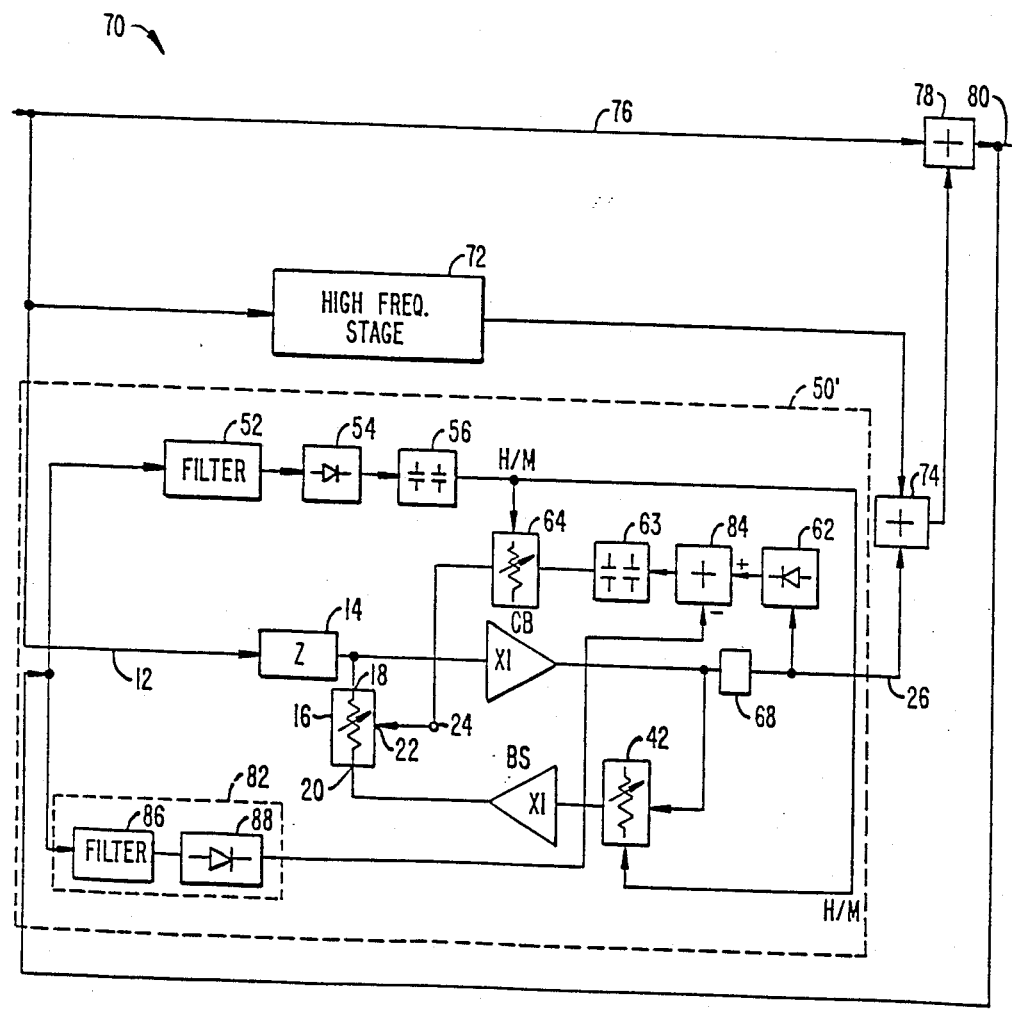
FIG._5.

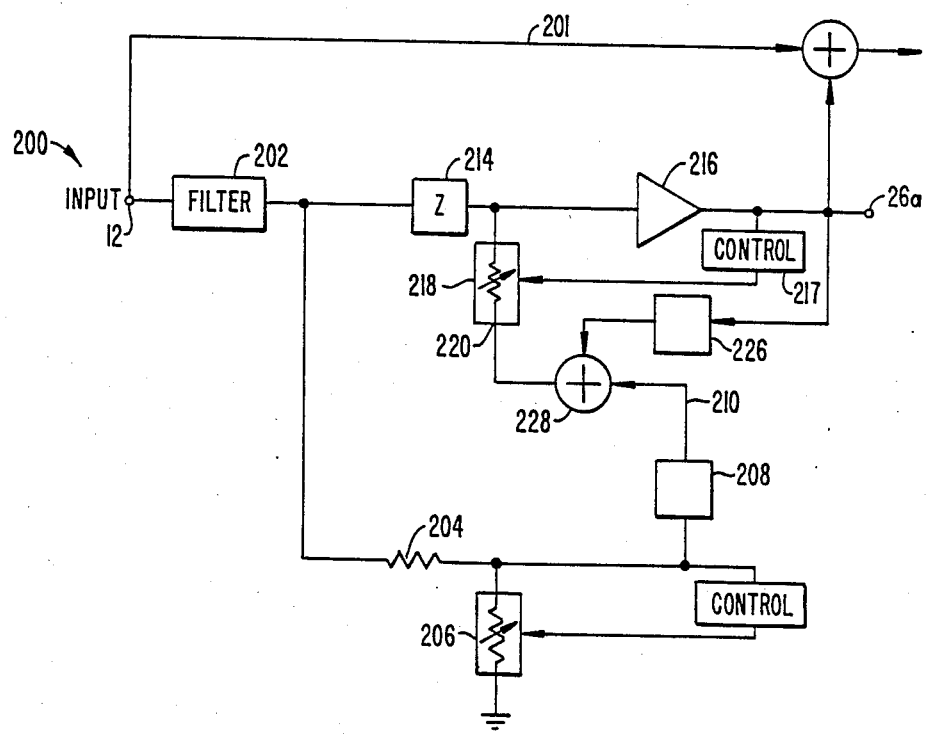
FIG._6.

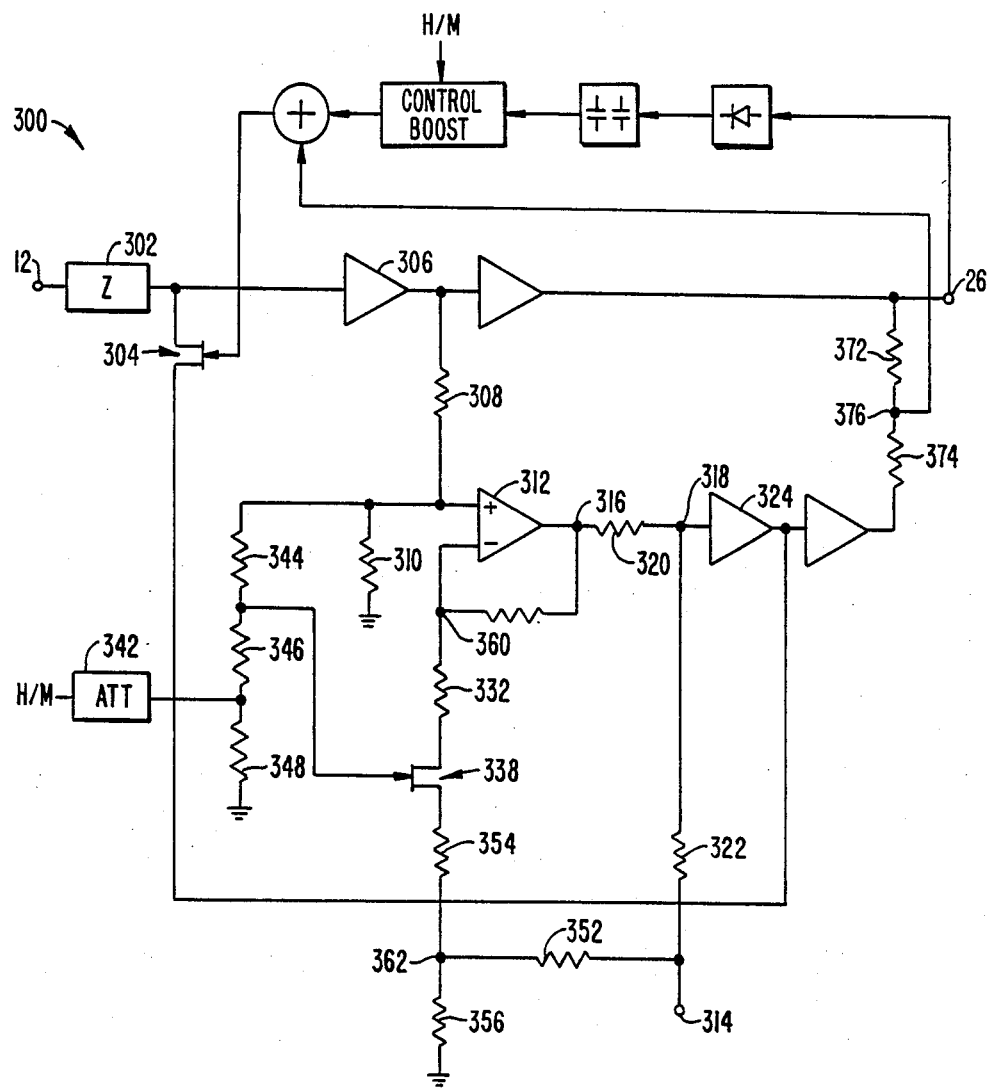
FIG._7.

ATTENUATOR CIRCUIT EMPLOYING BOOTSTRAPPING

CROSS-REFERENCE TO RELATED APPLICATION

This application is a continuation-in-part application of Ser. No. 06/835,245, filed Mar. 3, 1986, entitled "Attenuator Circuit Employing Bootstrapping", and now abandoned.

BACKGROUND OF THE INVENTION

This invention relates in general to attenuator circuits and more specifically to attenuator circuits employing bootstrapping.

Circuit elements such as field effect transistors (FETs) have been used to provide variable impedances in signal attenuators. For example, they have been used in limiters for noise reduction systems where compressors and expanders require controlled limiting of the amplitude of a signal. In U.S. Pat. No. 4,498,055, a field effect transistor is used in conjunction with a capacitor to form a high pass filter with a sliding band type high frequency shelf response whose corner frequency varies as a function of the control signal to the gate of the transistor. In this particular high pass filter circuit the drain-source path of the FET shunts the signal to be limited to ground.

A field effect transistor can be used in conjunction with an inductor to form a sliding band circuit with a low frequency shelf response operating downwardly. A field effect transistor may also be used in conjunction with a resistor to form a fixed band circuit whose frequency range does not change, in contrast to the sliding band attenuators.

When used in noise reduction systems, it is desirable for the circuit elements such as field effect transistors to be operating within a range of signal amplitudes where the impedances of the elements are linear, i.e. does not introduce waveform distortion into the signal. For FETs, this means that the transistors should be operated with their drain-source voltages within a range depending on the type of FETs so that the drain-source current of the FETs vary linearly with the voltage applied across the source and drain. When the drain-source voltage applied to a FET is not within such range, this introduces distortion in the waveform of the signal undergoing compression or expansion of dynamic range. It is therefore desirable to provide attenuator circuits employing elements such as FETs for which the above described difficulties are alleviated.

One way to alleviate the difficulty is to limit the signal amplitude across the element. This, however, reduces the signal to noise ratio and is disadvantageous. It is therefore desirable to provide attenuator circuits which avoid distortion and yet maintain a good signal to noise ratio.

SUMMARY OF THE INVENTION

This invention is based on the realization that distortion in attenuator circuits employing variable impedance circuit elements is reduced by reducing the signal amplitude across the elements, in particular by bootstrapping the elements. According to the invention, the circuit for attenuating signals comprises a circuit element having a variable impedance for attenuating a signal. The element has a first and a second terminal and a control terminal. The signal to be attenuated is applied through an impedance to the first terminal. The impedance between the first and second terminals varies as a first function of a control signal applied to the control terminal when the voltage difference across the first and second terminals is less than a predetermined value. The circuit also comprises means for detecting a signal condition which causes the voltage across the first and second terminals to exceed the predetermined value, causing distortion in the waveform of the signal. The detecting means generates an output signal to indicate the signal condition. The circuit further comprises a bootstrapping means responsive to the detecting means output for applying to the second terminal a fraction of the voltage at the first terminal to reduce the voltage difference between the terminals. The fraction is a second function of the output signal of the detecting means. The bootstrapping reduces the voltage across the element and the distortion produced.

A side effect of bootstrapping is that the effective impedance of the circuit element is increased as seen at the first terminal. To compensate for such alteration, the control signal applied to the control terminal of the element may be modified to reduce the effect of bootstrapping on the effective impedance. Thus, in the preferred embodiment of the invention, the circuit further comprises a modifying means which modifies the control signal in such manner that the effective impedance of the element remains substantially the first function of the control signal. This is referred to below as control boost.

The concept of bootstrapping for reducing distortion as described above can be advantageously applied in circuits for modifying the dynamic range of an input signal to reduce noise. One type of such circuits, known as a "dual path" circuit, employs a main path which is substantially linear with respect to dynamic range which receives the input signal. The dual path circuit also has a further path which has its input derived from at least one point in the main path and its output signal combined with the output of the main path to modify the dynamic range of an input signal. The further path includes an impedance element to attenuate the input signal to the further path. The element has a first, a second and a control terminal. The impedance between the first and second terminals varies as a first function of a first control signal applied to the control terminal. The circuit also includes means for deriving from at least one point in the circuit a control signal for controlling the impedance of the element. When signal conditions in the circuit are such that the voltage between the first and second terminals exceeds a predetermined value characteristic of the element, the element introduces distortion. According to the teachings of the invention, a bootstrapping means is used to apply to the second terminal a fraction of the voltage at the first terminal so that the voltage between the first and second terminals does not exceed the predetermined value.

The circuit for modifying dynamic range may have a fixed band or sliding band characteristic action. Either fixed or variable bootstrapping may be applied to reduce distortion. In fixed bootstrapping, a bootstrapping means applies a fixed fraction of the voltage at the first terminal to the second terminal to reduce the voltage difference between the terminals by a fixed factor. In variable bootstrapping, the circuit comprises means for detecting a signal condition which causes the voltage across the terminals to exceed the predetermined value which defines the upper limit for such voltage in order that the impedance of the element remains linear. The bootstrapping means responds to the output of the detecting means to adjust the fraction of the voltage at the first terminal bootstrapped to the second terminal to achieve variable bootstrapping.

BRIEF DESCRIPTION OF THE DRAWINGS

FIG. 1 is a schematic circuit diagram of an attenuator circuit where fixed bootstrapping is applied to reduce distortion to illustrate the invention.

FIG. 2 is a schematic circuit diagram of an attenuator where variable bootstrapping is applied to illustrate the invention.

FIG. 3 is a schematic circuit diagram of an attenuator where variable bootstrapping is applied and where the effect of bootstrapping on the effective impedance of the attenuator is compensated for to illustrate the preferred embodiment of the invention.

FIG. 4 is a detailed schematic circuit diagram of a circuit for modifying dynamic range where variable bootstrapping and control boost are applied.

FIG. 5 is a schematic circuit diagram of a dual path circuit employing variable bootstrapping and modulation control to illustrate the preferred embodiment of the invention.

FIG. 6 is a schematic circuit diagram of a circuit for modifying dynamic range using action substitution.

FIG. 7 is a schematic circuit diagram of a circuit for modifying dynamic range where action substitution and variable bootstrapping are applied.

DETAILED DESCRIPTION OF THE INVENTION

FIG. 1 is a schematic circuit diagram of an attenuator in which fixed bootstrapping is applied. As shown in FIG. 1, the attenuator circuit 10 comprises an input port 12 to which an input signal to be attenuated is applied. The circuit also comprises an element 14 of fixed impedance and circuit element 16 providing a variable impedance. Element 16 has two terminals, 18, 20 and a control terminal 22. The current of element 16 varies as a linear function of the voltage across the element if the voltage difference between terminals 18, 20 is below a predetermined value which is characteristic of element 16.

If the input signal has a large amplitude, this may cause the voltage difference between terminals 18, 20 to exceed the predetermined value for element 16. When this happens the impedance between terminals 18, 20 is no longer linear. Hence, waveform distortion is introduced. To prevent this from happening, a fraction of the voltage at terminal 18 is applied to terminal 20 to reduce the voltage difference between terminals 18, 20. When this fraction is a constant, the above described scheme is referred to as fixed bootstrapping.

FIG. 1 is a schematic circuit diagram of an attenuator employing a fixed bootstrapping scheme to illustrate the invention. A voltage divider comprising resistors 32, 34 is used to select a fraction of voltage at terminal 18 to be applied at terminal 20. Two buffers 36, 38 are used to prevent the voltage divider from affecting the impedance characteristics of element 16. If desired amplifiers 36, 38 may have gains other than one to accomplish other various desirable results. Thus, the voltage divider applies a fraction of the voltage at terminal 18 to terminal 20, where the fraction is given by the ratio of the resistance of resistor 32 to the sum of the resistances of resistors 32, 34. As is evident from FIG. 1, such fraction is fixed.

By feeding back a fraction of the voltage at terminal 18 to terminal 20, bootstrapping causes the signal handling capability of the circuit to increase. A higher signal level therefore can be applied to the input, with a consequent improvement in the signal to noise ratio. However, if fixed bootstrapping is applied as in FIG. 1, the effective impedance of element 16 is increased even whe the signal conditions are such that bootstrapping is not required. This may or may not be disadvantageous depending on the circuit and circumstances.

FIG. 2 is a schematic circuit diagram of an attenuator circuit in which variable bootstrapping is applied to reduce distortion. The attenuator of FIG. 2 is similar to that of FIG. 1 except that, instead of employing a voltage divider, a variable impedance element 42 is used to vary the fraction of the voltage bootstrapped. Identical elements in FIGS. 1 and 2 are referred to by the same numerals. The voltage at terminal 18 is attenuated by element 42 before application to terminal 20, where the attenuation by element 42 is controlled by a second control signal referred to below as the high mode signal.

In many noise reduction systems, element 16 may be chosen so that, under most signal conditions, element 16 responds linearly. In other words, under most signal conditions, bootstrapping is not necessary. Variable bootstrapping, although more complex, is advantageous over fixed bootstrapping since bootstrapping is introduced only when signal conditions require it, namely, when the signal level across the variable impedance element is high.

In reference to FIG. 2, element 42 has no transmission when it is detected that the input signal does not cause the voltage difference between terminals 18 and 20 to exceed the predetermined value. When it is detected that the amplitude of the input signal causes element 16 to operate non-linearly, element 42 begins to conduct to reduce the voltage difference between terminals 18, 20 so that element 16 continues to operate linearly. The transmission of element 42 is controlled by a second control signal referred to below as the high mode signal, indicating that the attenuator circuit is operating under large amplitude signal conditions. The derivation of the high mode signal is described below in reference to FIG. 3.

FIG. 3 is a schematic circuit diagram of an attenuator circuit illustrating the preferred embodiment of the invention. Common elements to FIGS. 2 and 3 are labeled by the same numerals. As shown in FIG. 3, the high mode signal for controlling the amount of bootstrapping is derived from the input signal by a filter 52, a rectifier 54 and a smoothing circuit 56. Filter 52 is such that it passes only those signal components which will cause element 16 to operate non-linearly. Alternatively, high level signal conditions across the varaible impedance element 16 can be detected by connecting the high mode detector (filter 52, rectifier 54 and smoothing circuit 56) to the output of the element. Where element 16 is a FET, and where element 14 is an inductor, the attenuator 50 of FIG. 3 is a low pass filter with a sliding band type low frequency shelf response sliding downwardly. For such an attenuator used in a dual path compressor or expander, only high level high frequency signals will cause element 16 to operate non-linearly. In such event, filter 52 is a high pass filter. Then the presence of high level high frequency signals is indicated by a large amplitude high mode signal at the output of smoothing circuit 56. In this manner, the circuit acts as a detector for detecting signal conditions under which element 16 will operate non-linearly.

To compensate for the increase in effective impedance of element 16 caused by bootstrapping, the effective impedance can be reduced by modifying the control signal applied at port 24. This can be done by adding a variable gain element. The further variable gain element is controlled by the high mode signal. As shown in FIG. 3 this is performed by placing a variable gain element 64, whose transmission is controlled by the high mode signal, in the output of the rectifier 62 and smoothing circuit 63, whose feedback action controls the dynamic performance of circuit 50. Thus, when the amplttude of the input signal is such that it tends to cause element 16 to operate non-linearly, such signal condition will increase the high mode signal. This causes element 42 to conduct, thereby applying bootstrapping. The high mode signal also causes element 64 to increase its gain thereby increasing the control voltage applied to the gate of element 16. The impedance between terminals 18, 20 decreases when the voltage applied to control terminal 22 increases. This reduces the actual impedance of element 16 and therefore also the effective impedance as seen by the input signal at terminal 18. The undesirable effect of bootstrapping on the effective impedance of element 16 is therefore compensated.

Boosting the control signal at gate 22 to counteract the undesirable effect of bootstrapping is referred to herein as control boost. Since the amount of bootstrapping and the control boost signal are both controlled by the same high mode signal, it is possible to adjust the amount of the bootstrapping and the control boost so that the two effects cancel. The net result is that attenuator 50 is transparent to signal characteristics; in other words, the attenuation of attenuator 50 is independent of the amount of bootstrapping applied. When signal conditions call for no bootstrapping, both attenuators 42 and 64 have low gains and element 16 together with element 14 are capable of providing the low impedances required with little distortion. When signal conditions tend to introduce distortion as described, both bootstrapping and control boost are applied to eliminate distortion, where the effects of bootstrapping and control boost on the effective impedance of element 16 essentially cancel.

Since bootstrapping and control boost are both governed by the high mode signal, it is possible to adjust the amplitude of the bootstrapping and control boost so that their effects on the impedance as seen at terminal 18 cancel. The control boost and bootstrapping applied are both functions of the high mode signal. In order that the effects of control boost and bootstrapping on the effective impedance as seen at terminal 18 cancel, the two functions must be complementary to one another. Therefore, the components of attenuator 50 should be chosen so that the two functions are complementary.

The effects of bootstrapping and control boost may not cancel under very low impedance conditions. The minimum achievable impedance of a variable impedance element such as a FET may be of the order of 100 ohms, for example; this figure could effectively be raised to several hundred ohms by the bootstrapping. Fortunately, when a very low impedance is required, then the voltage across the element is low because of the attenuation introduced by the element. In this case, the bootstrapping and control boost are not needed or used and then the element can achieve its lowest value.

In the above description, causing the control voltage at the control terminal to be more positive is described to have the effect of decreasing the effective impedance of the variable impedance element. It will be understood that the invention is equally applicable to attenuators employing variable impedance elements whose effective impedances increase when the control voltage at the control terminal becomes more positive.

FIG. 4 is a detailed schematic circuit diagram of an attenuator circuit illustrating the preferred embodiment of the invention. Attenuator 100 comprises impedance elements 114, 116 for attenuating the input signal at input 12. The output signal appears at terminal 26 of the circuit. In FIG. 4 the impedance element 116 is a FET, with its drain at terminal 118 and source at terminal 120, and its gate at 122. The bootstrapping path comprises buffer 136, attenuator 137, a FET 42 and buffer 138. The drain voltage of the FET 116 is attenuated by attenuator 137 by a fixed ratio and by FET 42 by a variable amount determined by the high mode signal applied to the gate of FET 42.

The high mode signal is also applied to the gate of FET 140, whose drain-source path provides a parallel path to resistor 142. This is a control boost circuit. The output voltage at 26 is fed, through a rectifier and smoothing circuit 143 to the control boost voltage divider circuit comprising resistors 142, 144, 146. When FET 140 is conducting, resistor 142 is shunted, thereby reducing the resistance between resistors 144, 146 and providing an increased control gain (decreased loss) for the control voltage. The modulated control voltage is then fed through a DC amplifier 148 and resistor 152, and applied to gate 122 to cancel the effect of bootstrapping on the effective impedance of FET 116 as described above. The gain control of the high mode signal through the control boost path from output 26 to gate 122 and the gain control of the high mode signal for controlling the amount of bootstrapping are chosen so that their effects on the effective impedance of FET 116 cancel.

To reduce distortion, half of the drain-source voltage of FET 116 should be applied back to its gate at 122, that is, the gate voltage should be maintained half way between the drain voltage and source voltage, on an AC basis. The drain voltage of FET 116 passes through amplifiers 136, 154 and appears at node 164. The source voltage of FET 116 passes through buffer 156 and appears at node 162. As shown in FIG. 4, the voltage at node 170 is fed back to gate 122 of FET 116 to reduce distortion. Configured in such manner, the change in the source voltage of FET 116 at node 120 caused by bootstrapping does not affect the feedback of half the drain-source voltage to the gate of FET 116.

Bootstrapping may be advantageously applied in circuits for modifying dynamic range, such as in "dual path" circuit arrangements. As described in detail in U.S. Pat. No. 3,846,719; U.S. Pat. No. 3,903,485; U.S. Pat. No. 4,490,691 and U.S. Pat. No. Re. 28,426, audio noise reduction systems advantageously employ dual path arrangements. A "dual path" arrangement is one in which a compression or expansion characteristic is achieved through the use of a main path which is essentially free of dynamic action and one or more secondary or side paths having dynamic action. The side path or paths take their input from the input or output of the main path and the side path output or outputs are additively or subtractively combined with the main path in order to provide compression or expansion. Generally, a side path provides a type of limiting or variable attenuation and the manner in which it is connected to the main path determines if it boosts (to provide compression) or bucks (to provide expansion) the main path signal components. Dual path circuit arrangements can be found in the A-type, B-type and C-type noise reduction systems marketed and licensed by Dolby Laboratories of San Francisco.

As discussed above, an attenuator employing a device such as a FET is linear provided that the voltage across the device is below a predetermined value which is characteristic of the device. Thus, under high level signal conditions, it is necessary to ensure that the voltage across the device does not exceed the predetermined value so that the device will continue to function linearly to prevent distortion. In the A-type, B-type and C-type noise reduction systems marketed and licensed by Dolby Laboratories, this is inherent since these systems apply a high degree of limiting to the signal in the side paths, beginning at a low-level threshold.

As explained in U.S. Pat. No. 4,498,055 the high degree of limiting applied beginning at a low-level threshold may, in some circumstances, cause loss of noise reduction in the A, B and C-type systems. Thus, in fixed band noise reduction circuits, the presence of high level stop band signals may cause a reduction in the gain or loss applied in the pass-band. In sliding band circuits, the presence of high level stop-band signals may cause excessive sliding of the corner frequencies of the sliding shelf. In U.S. Pat. No. 4,498,055, the applicant disclosed in detail a scheme called modulation control which reduces the undesirable responses of compressors and expanders to the effect of stop-band signal components at high input signal levels. As explained in detail in such patent, for fixed band systems, the modulation control scheme raises the limiting threshold in the stop-band and reduces the degree of limiting. For sliding band systems, once the variable filter cut off frequency is about two to three octaves above the dominant signal frequency, the modulation control scheme counteracts further sliding of the filter.

In both the fixed and sliding band systems, suitably filtered or frequency weighted signals from the main signal path are rectified, and in some cases smoothed, and are fed in opposition to the control signals generated by the control circuits of the fixed or sliding band systems. Thus, when the modulation control scheme is applied, there is a significant reduced gain reduction or reduced sliding of the variable filters as a function of increasing input signal levels. The effect of modulation control is therefore to increase the levels of stop-band signal components in the side path at high input signal levels.

From the above, the reduced limiting provided by modulation control increases the level of stop-band signals in the side paths. These higher level stop-band signal may cause the voltage across attenuators in the side paths to exceed the predetermined limits for linear operation. In such contexts, bootstrapping may be advantageously applied to again assure linear operation of the attenuators in the side paths without requiring signal limiting.

Bootstrapping provides an alternative to the severe limiting applied in A, B and C-type systems. Variable bootstrapping provides a particularly desirable alternative. No bootstrapping is applied until high-level signal conditions are detected which may cause the attenuator to function in a nonlinear region. When such signal conditions are detected, bootstrapping is then applied, causing the voltage across the attenuator to remain less than such predetermined value, thereby assuring linear operation of the device.

FIG. 5 is a schematic circuit diagram of a dual path sliding band compressor circuit employing both variable bootstrapping and modulation control to illustrate the invention. In certain dual path noise reduction systems, it may be advantageous to employ two side paths or stages: one for handling the high frequency components and the other for handling the low frequency components of signals. Thus, attenuator circuit 50' forms the low frequency stage of compressor circuit 70. The outputs of the high frequency stage 72 and of the low frequency stage 50' are added by adder 74 and the sum signal added to the output of the main path 76 by adder 78 to give the output of the compressor at 80.

As is evident from a comparison of FIGS. 3 and 5, the attenuator circuit 50' is similar in structure to attenuator 50 of FIG. 3; identical elements in FIGS. 3 and 5 are referred to by the same numerals. As is well known from the U.S. patents on dual path circuit arrangements referred to above, the feedback action from the output of the side path in attenuator 50' to the control terminal 22 of impedance element 16 controls the dynamic performance of the low frequency signal components in compressor circuit 70. In attenuator 50', the high mode signal is preferably derived from the output 80 of the compressor 70 instead of from its input; other than such difference, the high mode signal applied to variable gain element 64 is derived in the same manner as in the case of FIG. 3.

The control signal in attenuator 50' is derived from its output signal at 26. However, before the control signal is modified by the high mode signal as described above in reference to FIG. 3, it is first bucked by a modulation control signal from modulation control circuit 82. Circuit 82 derives a modulation control signal indicative of the signal level of the stop-band components. By subtracting the modulation control signal from the control signal by means of combiner 84 and then smoothing the difference signal, the effect of high level stop-band signals on the control signal eventually applied to element 16 is reduced. Where attenuator 50' is a fixed band type circuit, this causes the attenuation applied to passband signal components to be less affected by stop-band signals. Where attenuator 50' is a sliding band circuit, this causes the sliding shelf not to slide more than is necessary.

After being bucked by the modulation control signal and before being fed back to control terminal 22, the control signal is modified by the high mode signal which controls the transmission of the variable gain element 64 in the feed back path in the same manner as that described in reference to FIG. 3. In FIG. 5, element 14 is an inductor which may be simulated by a gyrator circuit, so that circuit 50' is a low pass filter with a sliding band type low frequency shelf response sliding downwardly. The modulation control signal is derived from output 80 by a control circuit 82. In the control circuit 82, the input signal is amplified and rectified to provide the modulation control signal. As described in detail in U.S. Pat. No. 4,498,055 and summarized above, the modulation control signal from control circuit 82 reduces the degree of limiting applied by attenuator 50'. This has the effect of increasing the signal level at element 16. Under high level high frequency signal conditions, this may cause element 16 to function in a nonlinear region. Bootstrapping, whether fixed or variable, causes the voltage across element 16 to be less than the predetermined limit for linear operation, even though variable bootstrapping is particularly advantageous as explained above. In such manner bootstrapping and modulation control operate together to improve the characteristics of compressor 70.

In FIG. 5, the modulation control signal is derived from the output signal of the compressor, it will be understood that the modulation control signal can also be derived from the input 12 of the compressor as well; all such possible schemes for deriving modulation control signals are within the scope of this invention. Bootstrapping together with modulation control can also be applied to compressors and expanders employing attenuators in the form of fixed band circuits as well as high pass filters with an upwardly sliding high frequency shelf response. All such and similar configurations are within the scope of the invention.

In a low frequency stage of a compressor such as circuit 50' of FIG. 5, the low pass filter 68 may be placed at the input of the stage. However, it is more advantageous to place it at the location shown in FIG. 5 after the variable gain element for reasons explained below.

Under certain signal conditions, circuit 50' may generate transient distortions. Also, element 14 is an inductor simulated by a gyrator circuit which may generate high frequency noise. For these reasons it is desirable to place filter 68 at the position shown in FIG. 5. When placed in such position, low pass filter 68 attenuates any transient distortion generated by circuit 50' and reduces high frequency noise caused by the gyrator circuit. Where overshoot suppression is applied, overshoot suppression can be generated without the delay inherent in a low pass filter placed at the input of circuit 50'. When the low pass filter is placed at the position shown, however, the side effect is that quite high signal levels will appear at element 16. This element must be capable of handling high level, high frequency signals, since these signals are no longer attenuated by the low pass filter 68.

FIG. 6 is a schematic circuit diagram of another circuit for modifying dynamic range where bootstrapping can be advantageously applied. Circuit 200 of FIG. 6 is a noise reduction system showing two side paths, one from input 12 to output 26a and the other from input 12 with its output fed into the first path, together with a main path 201. The side path from input 12 to output 26a includes filter 202, impedance element 214 and buffer 216. The output at 26a is fed back through a control circuit 217 which includes a rectifier and a smoothing means to a variable impedance element 218 to control its impedance. Element 218 is connected to the side path between elements 214 and 216. Where element 214 is a capacitor, the above-described arrangement forms a sliding band high pass filter; where element 214 is an inductor, the above arrangement forms a sliding band low pass filter. The other side path from input 12 includes the resistor 204 and a feedback path through a control circuit and a variable impedance element 206 forming a fixed band signal attenuator.

The compression action resulting from one side path can be substituted for that of the other when the level and spectral content of the input signal components change. This is performed by connecting the output of the second side path to affect the output of the first side path. This for example can be performed by connecting the output of the second side path to node 220 of element 218 in the first side path. Bootstrapping can be applied to node 220 through attenuator 226 and summer 228, which adds to it the attenuated output of the fixed band side path.

FIG. 7 is a schematic circuit diagram of an attenuator 300 where action substitution, bootstrapping and control boost may all be applied to illustrate the preferred embodiment of the invention. Circuit 300 forms the side path of a companding noise reduction circuit, where the side path is from input 12 to output 26. The input signal at input 12 is attenuated by circuit elements 302, 304. Element 304, as shown in FIG. 7 is a FET. A fraction of the drain voltage of FET 304 is fed back to its source through a path including buffer 306, resistor 308, amplifier 312, resistor 320 and buffer 324. The drain voltage is attenuated by resistors 308, 310 forming a voltage divider circuit. The attenuated drain voltage is amplified by amplifier 312.

The output signal from another side path of a noise reduction circuit parallel to the path from input 12 to output 26 may be coupled to circuit 300 at port 314. In reference to FIGS. 6 and 7, for example, the output of the fixed band side path (referred to below as the action substitution signal), appearing at node 210 in FIG. 6, may be coupled to circuit 300 at node 314 to achieve action substitution. The bootstrap signal at node 316 may be added to the action substitution signal at node 314; this is accomplished at node 318 through resistors 320, 322 and the summed signal is then fed to the source of FET 304 through buffer 324.

The fraction of the drain voltage of FET 304 bootstrapped to its source is determined partly by the attenuation of the voltage divider circuit comprising resistors 308, 310 and by the gain of amplifier 312. If the maximum gain of amplifier 312 approaches the attenuation of the voltage divider circuit, then a bootstrap voltage between the voltage divider value and something approaching the full drain voltage (e.g. 90%) of FET 304 may be bootstrapped to the source of the FET. The gain of the amplifier 312 depends on the values of the resistors 332, 334 and 336 as well as the drain-source resistance of FET 338.

The drain-source resistance of FET 338 is controlled by the high mode signal as attenuated by attenuator 342 and resistors 344, 346, 348. When FET 304 is required to provide low impedances, the high mode signal has a small amplitude, and FET 338 is pinched off, so that the amount of bootstrapping is negligible. When signal conditions require bootstrapping, however, a high mode signal of sufficient magnitude will cause FET 338 to conduct, so that amplifier 312 has significant gain. This causes a sizable fraction of the drain voltage to be bootstrapped to the source for FET 304.

Since the action substitution signal is also fed to the source of FET 304, it is necessary to derive the bootstrapping signal such that the action substitution signal itself does not become bootstrapped. The action substitution signal at terminal 314 is coupled to the source of FET 338 through resistors 352, 354, 356. If the ratio of the values of resistors 352, 356 is related to the ratio of values of resistors 308, 310 and is one-tenth for example, then one-tenth of the drain voltage of FET 304 appears at node 360 and one-tenth of the substitution voltage appears at node 362. The action substitution signal is thereby excluded from the bootstrapping action.

In other words, when the action substitution voltage at terminal 314 raises the source voltage of FET 304, thereby reducing the drain-source voltage of the FET, the source voltage of FET 338 is raised by a similar proportion. This reduces the signal current to FET 338, which in turn reduces the output of amplifier 312. In such manner it is possible to prevent bootstrapping from affecting the action substitution. If resistors 372 and 374 are of equal values, a voltage halfway between the drain and source voltages of FET 304 is fed from node 376 to the gate of the FET to reduce distortion.

The above description of circuit implementation and method is merely illustrative thereof and various changes in arrangements or other details of the method or implementation may be within the scope of the appended claims.

I claim:

1. A circuit for attenuating signals comprising:
   a circuit element having a variable impedance for attenuating an input signal to obtain an attenuated output signal, said element having a first and second terminal and a control terminal, said input signal applied to the first terminal, wherein the impedance between the first and second terminals varies as a predetermined function of a first control signal applied to the control terminal when the voltage difference across the first and second terminals is less than a predetermined value;
   means for deriving a bootstrapping second control signal from the signal at a point in the circuit, said bootstrapping control signal for indicating a signal condition which causes the voltage across the first and second terminals to exceed said predetermined value, causing distortion in the output signal; and
   bootstrapping means responsive to the bootstrapping control signal for applying to the second terminal a fraction of the voltage at the first terminal when the bootstrapping control signal indicates said signal condition to reduce the voltage difference between the first and second terminals, where said fraction is of such magnitude that the voltage difference across the first and second terminals does not exceed the predetermined value.

2. The circuit of claim 1, further comprising means responsive to the bootstrapping control signal for modifying the first control signal applied to the control terminal of the element, thereby reducing the effect of the application of the fraction of the voltage at the first terminal to the second terminal on the effective impedance of the element.

3. The circuit of claim 2, wherein the modifying means modifies the first control signal in such manner that the effective impedance of said element remains substantially the predetermined function of the unmodified first control signal.

4. The circuit of claim 1, wherein said bootstrapping means comprises:
   an impedance element and at least one buffer amplifier connected between the first and second terminals, wherein the impedance of the impedance element is variable according to the bootstrapping control signal to control the magnitude of the fraction of the voltage at the first terminal applied to the second terminal.

5. The circuit of claim 1, wherein said circuit element is a field effect transistor whose drain and source are the first and second terminals respectively and whose gate is the control terminal of the element.

6. The circuit of claim 5, further comprising means for applying a voltage substantially half way between the drain and source voltages of the transistor to the gate of the transistor to reduce distortion.

7. The circuit of claim 1, wherein said deriving means comprises filter means for filtering the signal at the point in the circuit to pass only those signal components which tend to cause the voltage across the first and second terminals to exceed the predetermined value.

8. The circuit of claim 7, said deriving means further comprises means for rectifying and smoothing the signal components passed by the filter means to derive the bootstrapping control signal.

9. A device for modifying the dynamic range of an input signal within a frequency band, comprising:
   a first circuit having a fixed or sliding band characteristic action for compressing or expanding the dynamic range of input signal components;
   a second circuit including an impedance elements, said element having a variable impedance for attenuating an input signal, said element having a first and second terminal and a control terminal, said input signal applied to the first terminal, wherein the impedance between the first and second terminals varies as a predetermined function of a dynamic modification control signal applied to the control terminal when the voltage difference across the first and second terminals is less than a predetermined value; said second circuit having a sliding band characteristic action for compressing or expanding the dynamic range of signal components;
   means for coupling the output of the first circuit to the second circuit, so that the characteristic action of one circuit substitutes for the characteristic action of the other circuit in at least a portion of the frequency band; and
   bootstrapping means for applying to the second terminal a fraction of the voltage at the first terminal to reduce the voltage difference between the first and second terminals.

10. The device of claim 9, further comprising means for deriving a bootstrapping control signal from the signal at a point in the second circuit, said bootstrapping control signal for indicating a signal condition which causes the voltage across the first and second terminals to exceed said predetermined value, causing distortion in the compression or expansion of the signal, and wherein said bootstrapping means applies the fraction to the second terminal only when the bootstrapping control signal indicates said signal condition and wherein the fraction of the first terminal voltage applied to the second terminal by the bootstrapping means is of such magnitude that it prevents the voltage across the first and second terminals from exceeding the predetermined value.

11. The circuit of claim 10, further comprising means responsive to the bootstrapping control signal for altering the dynamic modification control signal applied to the control terminal of the element, wherein the altering means alters the dynamic modification control signal in such manner that the impedance of said element remains substantially the preedetermined function of the unaltered dynamic modification control signal.

12. A device for modifying the dynamic range of input signals within a frequency band, comprising:
   a circuit including an impedance element, said element having a variable impedance for modifying the dynamic range of an input signal, said element having a first and second terminal and a control terminal, said input signal applied to the first terminal;

means for applying a dynamic modification control signal to said control terminal, wherein the impedance between the first and second terminals varies as a function of the dynamic modification control signal applied to the control terminal when the voltage difference across the first and second terminals is less than a predetermined value; said circuit having a sliding band characteristic action for compressing or expanding the dynamic range of signal components; and bootstrapping means for applying to the second terminal a fraction of the voltage at the first terminal to reduce the voltage difference between the first and second 13. The device of claim 12, further comprising means for deriving a bootstrapping control signal from a point in the circuit, said bootstrapping control signal for indicating a signal condition which causes the voltage across the first and second terminals to exceed said predetermined value, causing distortion in the compression or expansion of the signal, and wherein the bootstrapping means applies said fraction to the second terminal only when the bootstrapping control signal indicates said signal condition and wherein said fraction of the first terminal voltage applied to the second terminal by the bootstrapping means is of such magnitude that it substantially prevents the voltage across the first and second terminals from exceeding the predetermined value.

14. The circuit of claim 13, further comprising means responsive to the bootstrapping control signal for altering the dynamic modification control signal applied to the control terminal of the element, wherein the altering means alters the dynamic modification control signal in such manner that the impedance of said element remains substantially the predetermined function of the unaltered dynamic modification control signal.

15. The device of claim 13, wherein the circuit is part of a sliding band filter.

16. The device of claim 15, wherein said deriving means comprises a filter means for filtering the signal at the point in the circuit to pass only those signal components which tend to cause the voltage across the first and second terminals to exceed the predetermined value.

17. The device of claim 16, said device further comprising an inductance means so that the sliding band filter is a sliding band low pass filter and wherein the filter means is a high pass filter.

18. The device of claim 12, wherein said impedance element is a FET, said device further comprising means for applying a voltage substantially half way between the drain and source voltages of the transistor to the gate of the transistor to reduce distortion.

19. A circuit for modifying the dynamic range of an input signal, comprising:

a main signal path which is substantially linear with respect to dynamic range, the main path receiving the input signal at its input;

a further signal path which has its input derived from at least one point in the main path and its output signal combined with that of the main signal path to provide the output of the circuit;

said further path comprising:

(a) a frequency selective circuit determining a frequency pass-band within which the dynamic modification takes place, said input signal including both pass-band and stop-band signal components;

(b) dynamic modification circuit means to effect progressive dynamic modification of signal components in that pass-band or to effect progressive sliding of the frequency pass-band, whereby the dynamic range is modified, the dynamic action of the dynamic modification circuit means being responsive to the pass-band signal components and the stop-band signal components within the circuit arrangement, wherein for high level input signals the dynamic action of the dynamic modification circuit means becomes less responsive to stop-band signal components wherein the dynamic modification circuit means comprises a variable impedance element for effecting dynamic modification, said element having a first and a second terminal and a control terminal, the first and second terminals being in the further path so that the input signal to the further path is attenuated by the variable impedance of the element to provide an attenuated output signal for the further path, wherein the impedance between the first and second terminals varies as a predetermined function of a dynamic modification control signal generated in the dynamic modification circuit means and applied to the control terminal of the element, and wherein the element introduces distortion when the voltage between the first and second terminals exceeds a predetermined value;

wherein at high level stop-band signal conditions, the dynamic action of the dynamic modification circuit means is such as to tend to increase the probability that the voltage across the first and second terminals exceeds the predetermined value; and (c) bootstrapping means for applying to the second terminal a fraction of the voltage at the first terminal so that the voltage difference between the first and second terminals does not exceed the predetermined value to reduce distortion.

20. The device of claim 19, further comprising means for deriving a bootstrapping control signal from the signal at a point in the dynamic modification circuit means, said bootstrapping second control signal indicating a signal condition which causes the voltage across the first and second terminals to exceed said predetermined value, causing distortion in the compression or expansion of the signal, and wherein said fraction of the first terminal voltage applied to the second terminal by the bootstrapping means varies with the bootstrapping control signal such that the voltage difference across the first and second terminals does not exceed the predetermined value.

21. The circuit of claim 20, said dynamic modification circuit means further comprising means responsive to the bootstrapping control signal for altering the dynamic modification control signal applied to the control terminal of the element, wherein the altering means alters the dynamic modification control signal in such manner that the impedance of said element remains substantially the predetermined function of the unmodified dynamic modification control signal.

22. The circuit of claim 19, wherein the pass-band is at lower frequencies than the stop-band, said frequency selective circuit including a low pass filter means between the element and the output of the further path, wherein the dynamic modification control signal is derived from the output of the low pass filter, said dynamic modification circuit means further comprising an inductor means between its input and the first terminal, said low pass filter means reducing high frequency noise and transient distortion introduced by the inductor means and other components of the circuit.

23. The circuit of claim 22, wherein when signal components with frequencies above the cut-off frequency of the low pass filter tend to cause the voltage between the first and second terminals to exceed said predetermined value, the bootstrapping means prevents said voltage from exceeding the predetermined value to prevent distortion of the signal.

24. The circuit of claim 19, said dynamic modification circuit means further comprising:
   means for deriving a first reference signal from the input of the circuit, said first reference signal varying with the level of input signal components in the stop-band;
   means for deriving from at least one point in the further path a second reference signal which varies with the level of input signal components in the pass-band;
   means for subtractively combining the first and second reference signals for deriving the dynamic modification control signal, thereby increasing the probability that signal conditions in the circuit will tend to cause the voltage between the first and second terminals to exceed the predetermined value, wherein said bootstrapping means counteracts such tendency, causing the voltage to be less than the predetermined value to assure linear operation of the impedance element.

25. The circuit of claim 19, said dynamic modification circuit means further comprising:
   means for deriving a first reference signal from the output of the circuit, said first reference signal varying with the level of input signal components in the stop-band;
   means for deriving from at least one point in the further path a second reference signal which varies with the level of input signal components in the pass-band;
   means for subtractively combining the first and second reference signals for deriving the dynamic modification control signal, thereby increasing the probability that signal conditions in the circuit will tend to cause the voltage between the first and second terminals to exceed the predetermined value, wherein said bootstrapping means counteracts such tendency, causing the voltage to be less than the predetermined value to assure linear operation of the impedance element.

* * * * *

UNITED STATES PATENT AND TRADEMARK OFFICE
CERTIFICATE OF CORRECTION

PATENT NO. : 4,786,879

DATED : November 22, 1988

INVENTOR(S) : Ray M. Dolby

It is certified that error appears in the above-identified patent and that said Letters Patent is hereby corrected as shown below:

Col. 12, line 19: "elements" should be --element--

Col. 12, line 63: "preedetermined" should be --predetermined--

Col. 13, line 18: "and second" should be --and second terminals.--

Signed and Sealed this

Thirtieth Day of May, 1989

Attest:

DONALD J. QUIGG

Attesting Officer

Commissioner of Patents and Trademarks